US011965578B2

(12) United States Patent
Sun et al.

(10) Patent No.: US 11,965,578 B2
(45) Date of Patent: Apr. 23, 2024

(54) METHOD FOR INERTER WITH ADAPTIVELY ADJUSTED INERTIA RATIO

(71) Applicant: DALIAN UNIVERSITY OF TECHNOLOGY, Liaoning (CN)

(72) Inventors: Ximing Sun, Liaoning (CN); Nan Duan, Liaoning (CN); Yuhu Wu, Liaoning (CN); Chongquan Zhong, Liaoning (CN)

(73) Assignee: DALIAN UNIVERSITY OF TECHNOLOGY, Liaoning (CN)

( * ) Notice: Subject to any disclaimer, the term of this patent is extended or adjusted under 35 U.S.C. 154(b) by 391 days.

(21) Appl. No.: 17/430,548

(22) PCT Filed: Oct. 6, 2020

(86) PCT No.: PCT/CN2020/119818
§ 371 (c)(1),
(2) Date: Aug. 12, 2021

(87) PCT Pub. No.: WO2022/073152
PCT Pub. Date: Apr. 14, 2022

(65) Prior Publication Data
US 2022/0163094 A1    May 26, 2022

(51) Int. Cl.
*F16F 15/31* (2006.01)
*F16F 15/133* (2006.01)
(Continued)

(52) U.S. Cl.
CPC .......... *F16F 15/31* (2013.01); *F16F 15/1333* (2013.01); *F16F 15/13484* (2013.01); *F16F 15/139* (2013.01)

(58) Field of Classification Search
CPC ........................... F16F 15/31; F16F 15/13128
See application file for complete search history.

(56) References Cited

U.S. PATENT DOCUMENTS 10,508,709 B2* 12/2019 Oi .................. F16F 15/137
11,668,369 B2* 6/2023 Oi .................. F16F 15/145
                                                       74/574.2
(Continued)

FOREIGN PATENT DOCUMENTS

CN    104011427 A    8/2014
CN    109114164 A    1/2019
(Continued)

*Primary Examiner* — Daniel D Yabut
(74) *Attorney, Agent, or Firm* — Muncy, Geissler, Olds & Lowe, P.C.

(57) ABSTRACT

A design method for an inerter with adaptively adjusted inertia ratio is based on a lead screw-flywheel inerter, which is to change the positions of mass blocks on a flywheel along the radial direction of the flywheel, so as to change of the moment of inertia of the flywheel, and thus to realize adaptive adjustment of the inertia ratio of the inerter. Specifically, the change of angular velocity of the flywheel is caused by the change of an external force load on a lead screw, a centrifugal force on the mass blocks in spring-mass block structures is changed by the angular velocity, and the positions of the mass blocks in the radial direction of the flywheel is determined by the balanced relation of the centrifugal force and a spring restore force, so that the design purpose is achieved.

1 Claim, 3 Drawing Sheets

(51) Int. Cl.
  *F16F 15/134*  (2006.01)
  *F16F 15/139*  (2006.01)

(56) References Cited

U.S. PATENT DOCUMENTS

| | | | | |
|---|---|---|---|---|
| 2009/0320640 A1 * | 12/2009 | Elliott | ..................... | F03G 3/08 |
| | | | | 74/572.21 |
| 2015/0247551 A1 * | 9/2015 | Lorenz | .............. | F16F 15/13128 |
| | | | | 475/329 |
| 2015/0316123 A1 * | 11/2015 | Dögel | .............. | F16F 15/13128 |
| | | | | 74/572.2 |

FOREIGN PATENT DOCUMENTS

| | | | | | |
|---|---|---|---|---|---|
| CN | 110805652 | A | | 2/2020 | |
| CN | 113864401 | A | * | 12/2021 | |
| DE | 29818444 | U1 | * | 2/2000 | ............... B60B 1/06 |
| DE | 102007025650 | A1 | * | 12/2008 | ........ F16F 15/13128 |
| DE | 102017125922 | A1 | * | 5/2018 | ............. F16F 15/31 |
| FR | 2498327 | A1 | | 7/1982 | |
| JP | 2003244891 | A | | 8/2003 | |
| RU | 2634066 | C2 | * | 10/2017 | |

* cited by examiner

METHOD FOR INERTER WITH ADAPTIVELY ADJUSTED INERTIA RATIO

TECHNICAL FIELD

The present invention belongs to the technical field of controller structural design and analysis in a control system, relates to the design of an inerter with adaptively adjusted inertia ratio, and carries out simulation verification to the inerter.

BACKGROUND

Inerters are a kind of mechanical structures which can provide inertia ratio far greater than the structural mass thereof, and have been widely studied in vibration control in the fields of vehicle suspension systems, bridges, buildings and machinery. Inerters have incomparable advantages in reducing the structural mass of vibration controllers due to the large inertia ratio and small structural mass thereof. At present, an inerter mainly utilizes the effect that the moment of inertia of the structure thereof is greater than the inertia brought by the mass thereof, and further utilizes the structures such as gears or ball screws to increase the inertia ratio. However, the inertia ratio of such inerter is a constant value, it is difficult to make necessary adjustment following the change of the vibration condition of the main structure, and the inertia ratio cannot be adjusted, so that it is difficult to achieve an optimal vibration control effect. The present invention designs an inerter of which the inertia ratio can be adaptively adjusted according to the change of the vibration response of the main structure based on the system inertia requirements of vibration control. The present invention is based on a ball screw-flywheel inerter, which is to reduce the basic moment of inertia of a flywheel, add spring-mass block structures which have high density and move in the radial direction of the flywheel to a disk of the flywheel, and change the radial distance between the centroid of mass blocks and the center of rotation by the force balance between a centrifugal force and a spring restore force on the mass blocks during the rotation of the flywheel, so as to realize the adaptive adjustment of the moment of inertia of a flywheel according to the vibration condition of the main structure, and thus to achieve the purpose of automatically adjusting the inertia ratio of the inerter. Finally, the feasibility and the validity of the present invention are verified by a simulation method. So far, no patent has disclosed a design related to an inerter with adaptively adjusted inertia ratio.

SUMMARY

In order to better meet the requirements of the controller for variable inertia in the process of vibration control, the present invention designs an inerter with adaptively adjusted inertia ratio.

By analyzing the inertia requirements in the process of vibration control and understanding the principle of the inerter, a flywheel of an original lead screw-flywheel inerter is changed into two parts: a basic moment of inertia part and an adjustable moment of inertia part. The basic moment of inertia part is an ordinary flywheel, and an installation mechanism used for installing the adjustable moment of inertia part is machined thereon. At the same time, in order to increase the changing range of the overall moment of inertia, the basic moment of inertia part is made of aluminum alloy with low density and sufficient strength. The adjustable moment of inertia part is based on the design of spring-mass block structures, which is to automatically adjust the distance between the centroid of mass blocks and the center of rotation of the flywheel by the force balance between a centrifugal force and a spring restore force on the mass blocks during the rotation of the flywheel, so as to realize the automatic adjustment of the moment of inertia of the flywheel. Considering that the adjustable range of moment of inertia need to be increased, the mass blocks are made of copper or copper alloy with relatively high density and good self-lubricating property. Finally, a condition in which inertia ratio is changed along with an external force load is simulated by a numerical method to verify the feasibility and the validity of the present invention.

The technical solution of the present invention is as follows:

A design method for inerter with adaptively adjusted inertia ratio, comprising the following steps:

Step 1: basic theoretical design of an inerter with adaptively adjusted inertia ratio The theoretical basis of an adjustable moment of inertia structure in the inerter is the force balance of the spring-mass block structures between the centrifugal force on the mass blocks and the spring restore force during the rotation of the flywheel, and a movement equation thereof is expressed as follows:

$$m\frac{d^2R(t)}{dt^2} = m\omega^2(t)R(t) - k[R(t) - R_0] \quad (1)$$

Wherein the left side of the equal sign is an inertial force on the mass blocks; the first term on the right side of the equal sign is the centrifugal force on the mass blocks, and the second term on the right side of the equal sign is the spring restore force; m is the mass of the mass blocks, $\omega(t)$ is the angular velocity of the flywheel, R(t) is the distance between the centroid of the mass blocks and the center of rotation of the flywheel (i.e., the radius of rotation), k is the stiffness coefficient of springs, $R_0$ is the minimum distance between the centroid of the mass blocks and the center of rotation of the flywheel, and t is a time variable.

Based on the movement principle of a lead screw-nut sport pair, the movement equation between the angular velocity $\omega(t)$ of the flywheel and the load on a lead screw is expressed as the following differential equation:

$$J(t)\frac{d\omega(t)}{dt} = \frac{p}{2\pi}F_l(t) \quad (2)$$

Wherein p is the pitch of the lead screw; $F_l(t)$ is the load on the lead screw; J(t) is the moment of inertia of the flywheel and is expressed as:

$$J(t) = J_0 + nmR^2(t) \quad (3)$$

Wherein $J_0$ is the fixed moment of inertia of the flywheel; the second term on the right side of the equation represents the adjustable moment of inertia part of the flywheel, and n is the quantity of the spring-mass block structures; considering symmetry and balance of rotation, n is an integral multiple of 2.

It is obtained in combination with equations (1)-(3) that the adaptive inertia ratio of the inerter is:

$$b_v(t) = \left(\frac{2\pi}{p}\right)^2 [J_0 + nmR^2(t)] \quad (4)$$

The above is a theoretical principle of adaptive adjustment of the inertia ratio of the inerter designed.

Step 2: theoretical design of the structure of the flywheel with adjustable moment of inertia in the inerter with adaptively adjusted inertia ratio The purpose of the present invention is to adjust the inertia ratio of the inerter in a relatively large range. It can be known from equation (4) that, to achieve this purpose, the fixed moment of inertia $J_0$ of the flywheel need to be as small as possible, and the mass m of the mass blocks need to be increased. Taking the flywheel as a homogeneous disc making fixed axis rotation around the center, then the fixed moment of inertia of the flywheel is expressed by the following equation:

$$J_0 = \tfrac{1}{2} \rho V r^2 \qquad (5)$$

Wherein r is the radius of the flywheel, ρ is the density of the flywheel, and V is the total volume of the flywheel. It can be known in combination with equations (4) and (5) that the fixed moment of inertia $J_0$ of the flywheel can be reduced by using a material with relatively low density and reducing the volume of the flywheel in the condition that the radius of the flywheel is constant. Therefore, the main body of the flywheel of the present invention is made of aluminum alloy with relatively low density, and part of the material on the disk of the flywheel is removed so as to further reduce the fixed moment of inertia of the flywheel;

In order to obtain a relatively large adjustable range of inertia ratio, according to equation (3), and fully considering the limitation of the size of the inerter and the constraint to the radius of gyration of the flywheel, increasing the mass m and the quantity n of the mass blocks is a reasonable way to increase the adjustable inertia ratio of the inerter. After comprehensive consideration of the density, cost, machinability, self-lubricating and other properties of commonly used materials, copper is used as the material of the mass blocks.

Step 3: structural design of the adaptive adjustable flywheel of the inerter based on the above-mentioned theory The inerter designed by the present invention mainly comprises the following core components: a shell 3, the lead screw 4, the flywheel 5 and a nut 6.

The nut 6 is in solid connection to the flywheel 5, and the axis of the nut is coaxial with the center of rotation of the flywheel; the top of the lead screw 4 is an inerter endpoint B 2, the lead screw 4 is connected to the nut 6, and the lead screw-nut sport pair is composed by the lead screw 4 and the nut 6 to convert the rectilinear motion of the inerter endpoint B 2 into the rotational motion of the flywheel.

The flywheel 5 comprises a flywheel basic part 9, the springs 7 and the mass blocks 8. The flywheel basic part 9 is formed by removing part of the material on the disk of the flywheel 5; the flywheel 5 is provided with a plurality of guide grooves along the radial direction, and the mass blocks 8 are installed in the guide grooves and can make rectilinear motion along the radial direction of the flywheel. One end of each spring 7 is connected to each mass block 8, and the other end thereof is connected to one side of each guide groove near the center of rotation of the flywheel in order to provide a pulling force directing to the center of rotation of the flywheel for the mass block.

The shell 3 has a hollow structure, which packs a structure composed of the flywheel 5, the nut 6 and the lead screw 4 therein, so as to provide a relatively sealed and clean environment for the flywheel of the inerter and reduce the external interference during the operation of the inerter.

Step 4: simulation verification

As equations (1) and (2) are complex differential equations, it is difficult to obtain analytical solutions thereof. In order to verify the feasibility of the present invention, a MATLAB/Simulink simulation model of an adaptive inerter is built, and the present invention is verified correspondingly by simulated load signals. Simulation results show that the present invention can make a corresponding response to the change of an external load thereon, and the design purpose is achieved.

The present invention has the following beneficial effects:

1) Based on the dynamic characteristics of the centrifugal force and the spring restore force, the theoretical basis of adaptively adjusting the inertia ratio of the adaptive inerter along with the change of the load thereon is built, and this theoretical basis can effectively support the requirements for the design of the adaptive inerter and subsequent pertinent adaptive improvement;

2) Based on the theoretical basis of adaptive adjustment of the inertia ratio, the present invention designs the basic structure of a lead screw-flywheel inerter with adaptive adjustable inertia ratio, which can provide reference and guidance for subsequent similar inventions and applications; and 3) Corresponding simulation of the inerter is carried out based on simulated load signals, and the results show that the inertia ratio of the inerter designed by the present invention can be automatically adjusted according to the change of the load, and this property is exactly what is required for some passive vibration controllers.

Figure 1:
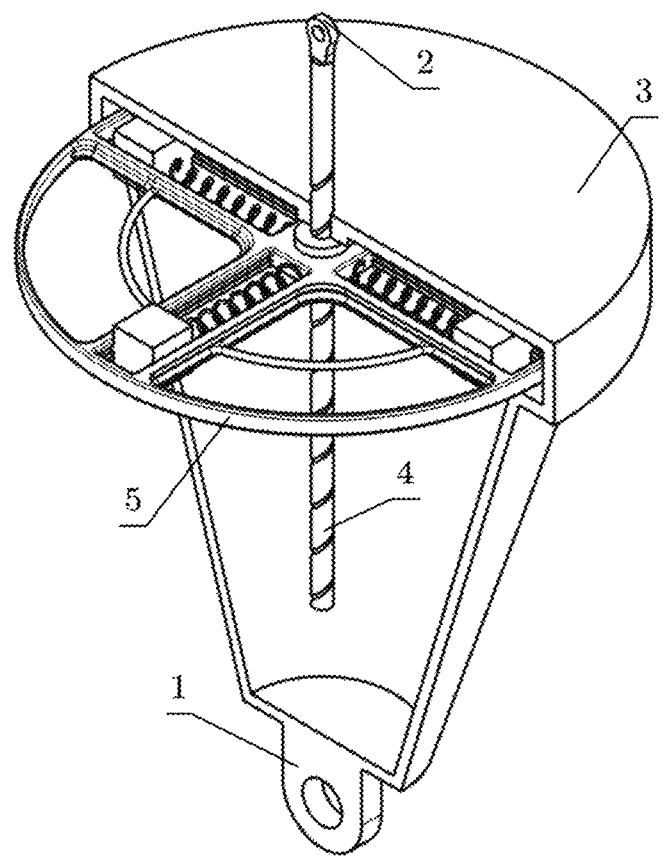
FIG. 1 is a structural schematic diagram of an inerter with adaptively adjusted inertia ratio.

In the figures: 1 inerter endpoint A; 2 inerter endpoint B; 3 shell; 4 lead screw; 5 flywheel; 6 nut; 7 spring; 8 mass block; and 9 flywheel basic part.

DETAILED DESCRIPTION

The specific design and embodiments of the present invention are described below in detail in combination with the drawings and the derivation process of the theoretical basis of the adaptive inertia ratio.

The specific process of this embodiment is conducted in view of the structure of the adaptive inerter shown in FIG. 1, and the detailed design steps are as follows:

Step 1: building a mathematical model of an inertia ratio adaptive adjustable structure of the adaptive inerter. For the physical structure of the adaptive inerter shown in FIG. 1, when the inerter endpoint A 1 and the inerter endpoint B 2 are subjected to an external force load, the external force load is converted into the torque of the flywheel under the action of the lead screw-nut sport pair, and thus to drive the flywheel to rotate. When the flywheel rotates at angular velocity ω(t), the centrifugal force $F_c(t)$ on a mass block m is expressed as $$F_c(t) = m\omega^2(t)R(t) \qquad (1)$$

Considering that when the mass block m moves along the radial direction of the flywheel, the spring restore force $F_k(t)$ on the mass block is $$F_k(t)=k[R(t)-R_0] \qquad (2)$$

According to Newton's law of motion, a resultant external force on the mass block m when the flywheel rotates is as follows $$ma = m\frac{d^2R(t)}{dt^2} = F_c(t) - F_k(t) \qquad (3)$$

Wherein a is the acceleration of the mass block m in the radial direction of the flywheel.

Equations (1) and (2) are substituted into equation (3) to obtain a movement equation of the flywheel rotating in a horizontal plane $$m\frac{d^2R(t)}{dt^2} = m\omega^2(t)R(t) - k[R(t) - R_0] \qquad (4)$$

In order to obtain the angular velocity $\omega(t)$ of the flywheel, it is necessary to obtain the movement equation of the flywheel under the external force load. The following relation exists for the flywheel $$J(t)\beta = N(t) \qquad (5)$$

Wherein $\beta$ is the angular acceleration of the flywheel and $$\beta = \frac{d\omega(t)}{dt},$$

N(t) is a resultant external torque, and considering the characteristics of the lead screw-nut sport pair, it can be obtained that N(t) is $$N(t) = \frac{p}{2\pi}F_l(t) \qquad (6)$$

Wherein $F_l(t)$ is the external force load on the lead screw. By substituting equation (6) and $\beta$ into equation (5), the movement equation of the flywheel under the action of the external force is $$J(t)\frac{d\omega(t)}{dt} = \frac{p}{2\pi}F_l(t) \qquad (7)$$

In equation (6), the moment of inertia of the flywheel J(t) is composed of the fixed moment of inertia part and the adjustable moment of inertia part of the flywheel, i.e., $$J(t)=J_0+nmR^2(t) \qquad (8)$$

Equations (4), (7) and (8) are the basic principle and theoretical basis of the adaptive adjustable moment of inertia of the inerter designed by the present invention, and then the inertia ratio of the inerter can be obtained as $$b_v(t) = \left(\frac{2\pi}{p}\right)^2 [J_0 + nmR^2(t)] \qquad (9)$$

Thus the basic principle of adaptive adjustment of the inertia ratio of the inerter designed by the present invention along with load is obtained.

Figure 2:
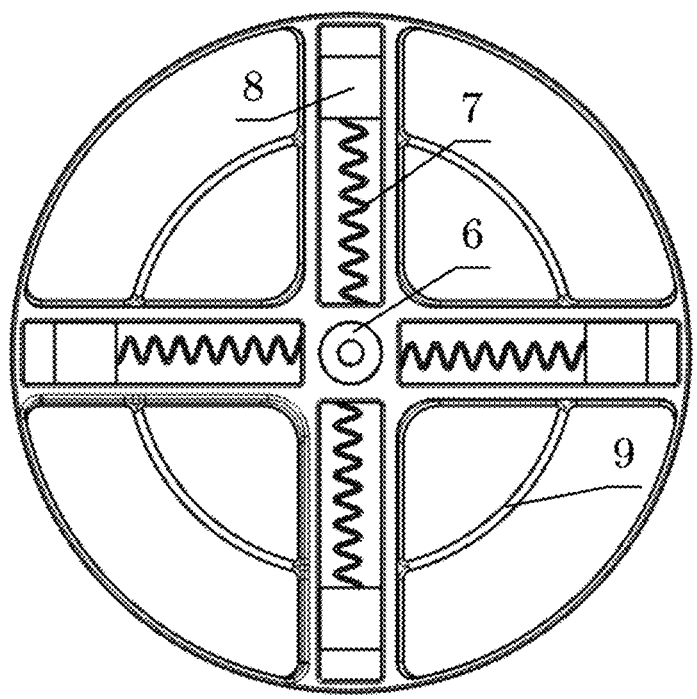
FIG. 2 is a structural schematic diagram of a flywheel with adaptively adjusted moment of inertia.

Step 2: considering that the main purpose of the present invention is to realize adaptive adjustment of the inertia ratio of the inerter in a relatively large range, i.e., to realize the adaptive adjustment of the moment of inertia of the flywheel. The flywheel rotating around the center can be considered as a disc having uniform density distribution and rotating around the center, then the fixed moment of inertia part thereof (the flywheel basic part 9 as shown in FIG. 2) can be expressed as $$J_0 = \tfrac{1}{2}\rho V r^2 \qquad (10)$$

In combination with equation (8), it can be known that reducing the basic moment of inertia $J_0$ is favorable for increasing the adjustable range of the overall moment of inertia J(t) of the flywheel. Considering equation (10), the basic moment of inertia $J_0$ of the flywheel can be reduced by reducing the volume V of the flywheel and using a material with a smaller density $\rho$ when the radius of gyration r is given.

Therefore, the flywheel basic part 9 in the inerter of the present invention is made of aluminum alloy with a density of 2.7 g/cm$^3$. In order to further reduce the basic moment of inertia of the flywheel, part of the material on the disk of the flywheel is removed (comparing 5 in FIG. 1 with 9 in FIG. 2) on the premise of ensuring that the structure of the flywheel has sufficient strength. Based on the above parameters and conditions, the basic moment of inertia $J_0=2\times10^{-4}$ kg·m$^2$ of the flywheel in the designed inerter is determined.

It can be known from the second term on the right side of equation (8) that in the condition that the diameter of the flywheel is fixed, increasing the mass m of the mass block and increasing the quantity n of the mass blocks is an important means to increase the adjustable range of the moment of inertia of the flywheel, therefore the mass block is made of copper with relatively large density and self-lubricating property, and is a cube with the length, the width and the height being all 20 mm, and both ends of the mass block are provided with slide blocks matched with slide rails on the flywheel to realize that the mass block moves along the radial direction of the flywheel under the action of the centrifugal force $F_c(t)$ and the spring restore force $F_k(t)$. It is determined that the mass of the mass block is 0.072 kg, and the quantity is 4. As shown in FIG. 2, each mass block 8 is connected to the flywheel 5 through each spring 7, so as to realize the change of the position R(t)=10~96 mm of the centroid of the mass block and the center of rotation of the flywheel.

Step 3: structural design of the adaptive adjustable flywheel of the inerter based on the above-mentioned theory The inerter designed mainly comprises the following core components: a shell 3, the lead screw 4, the flywheel 5 and a nut 6.

The nut 6 is in solid connection to the flywheel 5, the axis of the nut is coaxial with the center of rotation of the flywheel (as shown at the position of the nut 6 in FIG. 2), and the lead screw-nut sport pair is composed by the nut 6 and the lead screw 4 in order to convert the rectilinear motion of the inerter endpoint B into the rotational motion of the flywheel. The lead screw 4 and the nut 6 matched with the lead screw can be selected as required, and the pitch of the lead screw 4 selected to be p=10 mm.

The flywheel 5 is composed of a flywheel basic part 9, the springs 7 and the mass blocks 8. The mass blocks 8 are installed on the flywheel 5 which is provided with guide grooves along the radial direction, and the mass blocks 8 can make rectilinear motion along the radial direction of the flywheel. One end of each spring 7 is connected to each mass block 8, and the other end thereof is connected to one side of each guide groove near the center of rotation of the flywheel in order to provide a pulling force directing to the center of rotation of the flywheel for the mass block.

The shell 3 has a hollow structure in order to provide a relatively sealed and clean environment for the flywheel of the inerter and reduce the external interference during the operation of the inerter. Another function of the shell 3 is to facilitate the installation of the inerter, therefore the structure of the shell is not constant, can be specially designed according to the actual use requirements and installation conditions, and has no uniform requirements on style, material and the like, and the design of the shell is not explained too much in the present invention.

Step 4: simulation verification

Figure 3:
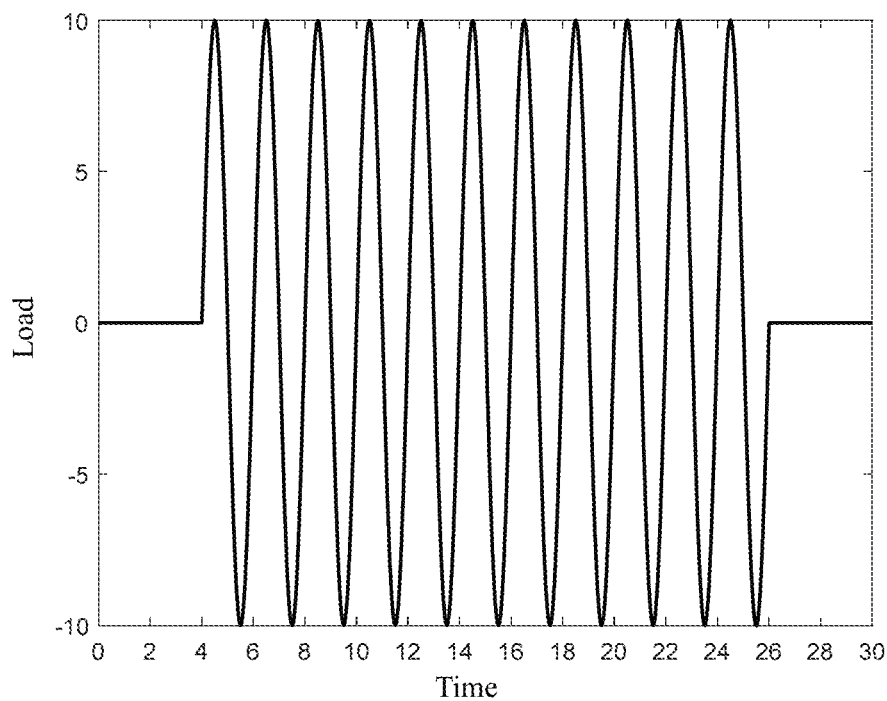
FIG. 3 shows harmonic signals of simulated external load in simulation.

The response of the inerter as shown in FIG. 1 under the external force load is verified and analyzed by simulation. According to the properties of the inerter, the external force load thereon is $$F_I(t)=F_2(t)-F_1(t) \tag{11}$$

Wherein $F_1(t)$ and $F_2(t)$ are respectively the external force loads on the endpoint A 1 and the endpoint B 2 of the inerter designed by the present invention. Considering the actual condition that the inerter endpoint A 1 is often used as a fixed point in the application of the inerter, the inerter endpoint A 1 is set to be a fixed end in the simulation verification of this step, i.e., $F_1(t)=0$. According to the actual condition, the external force load is set to be a harmonic load as shown in FIG. 3, and the harmonic amplitude is 10N. Relevant parameters of the inerter designed by the present invention are set to be n=4, m=0.28 kg, k=500 N/m, $J_0$=0.0002 kg·m$^2$, $R_0$=0.01m, p=0.01m. The change of the moment of inertia and the inertia ratio along with the load is verified by numerical simulation.

Figure 4:
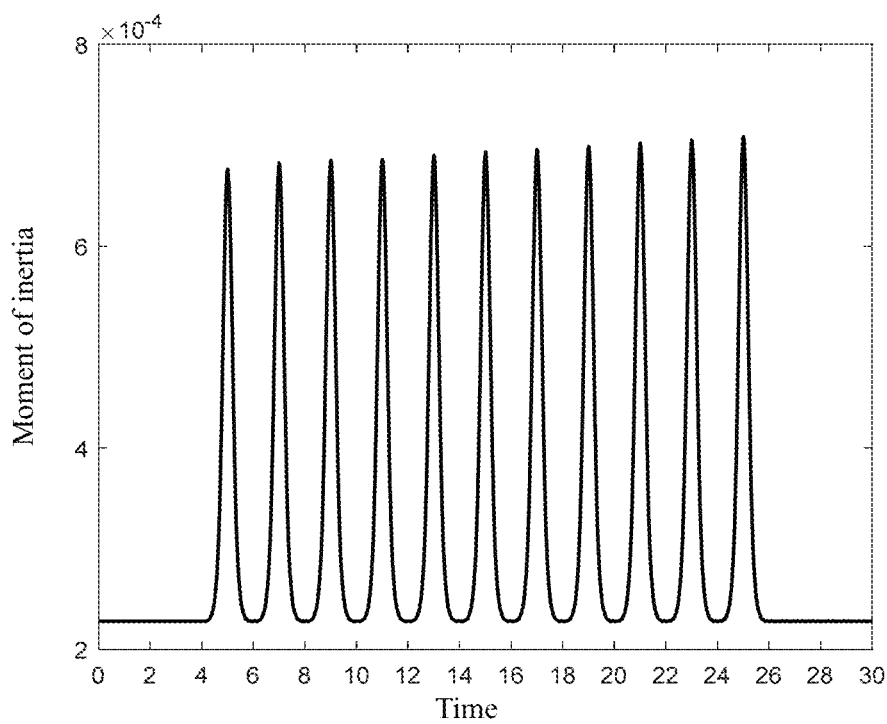
FIG. 4 shows change of moment of inertia of an inerter designed by the present invention under simulated external load.

FIG. 4 shows the change of the moment of inertia of the inerter designed by the present invention along with the external load. It can be seen from the figure that when the external force load begins to change at t=4 s (as shown in FIG. 3), the moment of inertia of the inerter also begins to increase and become greater. At t=5 s (as shown in FIG. 3, when the external force load changes to the half cycle of the maximum change rate), the moment of inertia of the inerter increases rapidly and reaches the maximum value (4.8×10$^{-4}$ kg·m$^2$) in a cycle; after that, the moment of inertia of the inerter decreases rapidly and restores to 2.8×10$^{-4}$ kg·m$^2$ (the basic moment of inertia plus the moment of inertia of the mass blocks in closest positions) near t=6 s. The later period in FIG. 4 further illustrates that the moment of inertia of the inerter designed by the present invention can be changed according to the change of the external force load.

Figure 5:
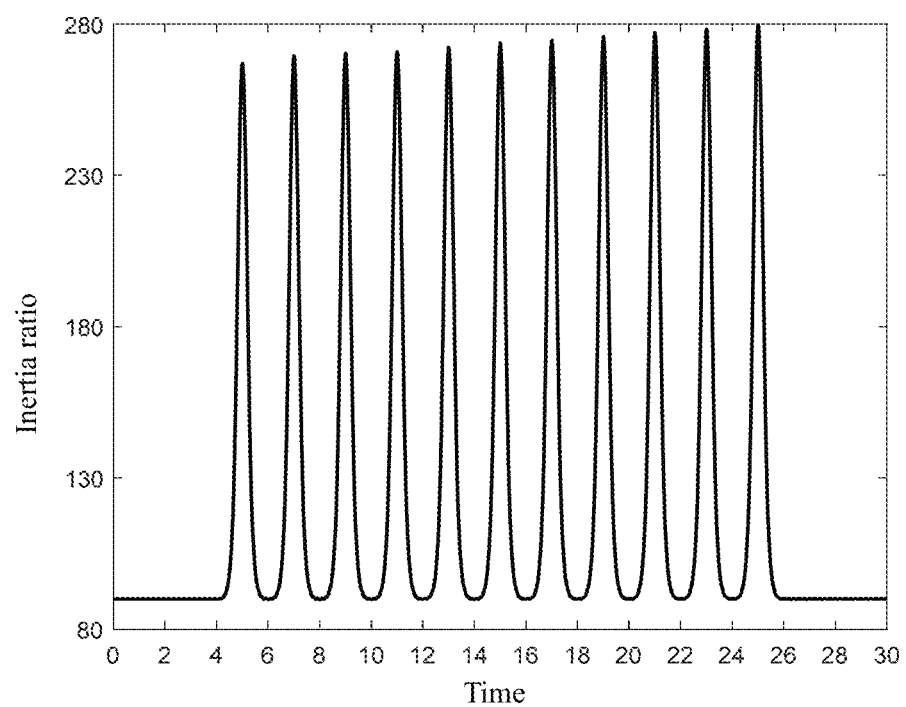
FIG. 5 shows change of inertia ratio of an inerter designed by the present invention under simulated external load.

In order to further verify the adaptive inerter designed by the present invention, the inertia ratio $b_v$ of the inerter is simulated as shown in FIG. 5. In combination with FIG. 3, it can be seen that along with the change of the external force load, the inertia ratio of the adaptive inerter designed by the present invention can be adaptively adjusted in a large range (89.8 kg-279.6 kg), which indicates that the inerter can meet the design purpose of adaptively adjusting the inertia ratio according to the external force load.

The above embodiments only express the implementation of the present invention, and shall not be interpreted as a limitation to the scope of the patent for the present invention. It should be noted that, for those skilled in the art, several variations and improvements can also be made without departing from the concept of the present invention, all of which belong to the protection scope of the present invention.

The invention claimed is:

1. A design method for a lead screw flywheel the inerter having a flywheel and an adaptively adjusted inertia ratio in order to reduce a basic moment of inertia of the flywheel, the flywheel having a disk with spring-mass block structures; a lead screw that is subjected to an external force load to make the flywheel rotate, the mass blocks are moved along the radial direction of the flywheel under the combined action of a centrifugal force and a spring restore force, and the change of positions of the mass blocks changes the moment of inertia of the flywheel accordingly, so that the inertia ratio of the inerter is adaptively adjusted along with the change of the external force load; the design method comprising steps of:

providing a mass distribution of the flywheel and the spring-mass block structures on the disk such that a relation between positions of the mass blocks in a radial direction of the flywheel and an angular velocity of the flywheel is obtained by a force balance between a centrifugal force on the mass blocks and a spring restore force during rotation of the flywheel, the relation being expressed as:

$$m\frac{d^2R(t)}{dt^2} = m\omega^2(t)R(t) - k[R(t)-R_0] \tag{1}$$

wherein the left side of the equal sign is an inertial force on the mass blocks; the first term on the right side of the equal sign is the centrifugal force on the mass blocks, and the second term on the right side of the equal sign is the spring restore force; m is mass of the mass blocks, $\omega(t)$ is angular velocity of the flywheel, R(t) is distance between the centroid of the mass blocks and the center of rotation of the flywheel, k is stiffness coefficient of springs, $R_0$ is minimum distance between the centroid of the mass blocks and the center of rotation of the flywheel, and t is a time variable;

providing a lead screw-nut sport pair such that a following movement equation between the angular velocity $\omega(t)$ of the flywheel and a load on a lead screw of the lead screw-nut sport pair is obtained as expressed as the following differential equation:

$$J(t)\frac{d\omega(t)}{dt} = \frac{p}{2\pi}F_l(t) \tag{2}$$

wherein p is a pitch of the lead screw; $F_l(t)$ is a load on the lead screw; and J(t) is a moment of inertia of the flywheel, J(t) being further expressed as:

$$J(t)=J_0+nmR^2(t) \tag{3}$$

wherein $J_0$ is a fixed moment of inertia of the flywheel; the second term on the right side of the equation represents an adjustable moment of inertia part of the flywheel, n is quantity of the spring-mass block structures, and n is an integral multiple of 2;

providing the inerter such that an adaptive inertia ratio is obtained, the ratio being expressed as:

$$b_v(t) = \left(\frac{2\pi}{p}\right)^2 [J_0 + nmR^2(t)] \tag{4}$$

providing the flywheel as a homogeneous disc making a fixed axis rotation around the center, the fixed moment of inertia of the flywheel being expressed as:

$$J_0 = \tfrac{1}{2}\rho V r^2 \tag{5}$$

wherein r is the radius of the flywheel, $\rho$ is the density of the flywheel, and V is the total volume of the flywheel;

providing a main body of the flywheel made of aluminum alloy, removing part of the material on the disk of the flywheel so as to further reduce the fixed moment of inertia of the flywheel;

providing the material of mass blocks as copper;

providing the inerter as further comprising a shell, the lead screw, the flywheel and a nut;

the nut being in solid connection to the flywheel, and the axis of the nut being coaxial with the center of rotation of the flywheel; the top of the lead screw being an inerter endpoint B; the lead screw being connected to the nut, and the lead screw-nut sport pair being composed by the lead screw and the nut to convert the rectilinear motion of the inerter endpoint B into the rotational motion of the flywheel;

the flywheel comprises a flywheel basic part, the springs and the mass blocks; the flywheel basic part being formed by removing part of the material on the disk of the flywheel; the flywheel being provided with a plurality of guide grooves along the radial direction, and the mass blocks being installed in the guide grooves and can make rectilinear motion along the radial direction of the flywheel; one end of each spring being connected to each mass block, and the other end thereof being connected to one side of each guide groove near the center of rotation of the flywheel;

the shell has having a hollow structure in the flywheel, the nut and the lead screw are disposed therein;

providing a numerical simulation model of the inerter with the adaptively adjusted inertia ratio, and verifying the numerical simulation model of the inerter with numerically simulated load signals.

\* \* \* \* \*